United States Patent
El-Nozahi et al.

(10) Patent No.: US 10,097,170 B2
(45) Date of Patent: Oct. 9, 2018

(54) CIRCUIT AND METHOD FOR LOW POWER CHIP ENABLE CIRCUITRY

(71) Applicant: Vidatronic Inc., College Station, TX (US)

(72) Inventors: Mohamed Ahmed Mohamed El-Nozahi, Cairo (EG); Mohamed Mostafa Saber Aboudina, Giza (EG); Sameh Ahmed Assem Ibrahim, Cairo (EG); Faisal Abdelatif Elsedeek Hussien, Cairo (EG)

(73) Assignee: Vidatronic, Inc., College Station, TX (US)

( * ) Notice: Subject to any disclaimer, the term of this patent is extended or adjusted under 35 U.S.C. 154(b) by 0 days.

(21) Appl. No.: 15/605,249

(22) Filed: May 25, 2017

(65) Prior Publication Data

US 2017/0346469 A1    Nov. 30, 2017

Related U.S. Application Data

(60) Provisional application No. 62/342,032, filed on May 26, 2016.

(51) Int. Cl.
*H03K 3/02* (2006.01)
*H03K 5/08* (2006.01)
*G11C 5/14* (2006.01)
*H03K 19/00* (2006.01)

(52) U.S. Cl.
CPC .............. *H03K 5/08* (2013.01); *G11C 5/14* (2013.01); *G11C 5/145* (2013.01); *H03K 19/0016* (2013.01); *H03K 2217/0036* (2013.01)

(58) Field of Classification Search
None
See application file for complete search history.

(56) References Cited

U.S. PATENT DOCUMENTS

| | | | |
|---|---|---|---|
| 6,275,421 B1 * | 8/2001 | Chen | G11C 7/1045 365/189.06 |
| 7,928,758 B2 * | 4/2011 | Yang | H02M 1/08 326/30 |

* cited by examiner

*Primary Examiner* — Long Nguyen
(74) *Attorney, Agent, or Firm* — Liang Legal Group, PLLC

(57) ABSTRACT

A novel low power enable circuit is less sensitive to power supply variations while consuming less than 50 nA of supply current. The enable circuit includes a voltage clamp circuit which limits the supply level for a first inverter. The clamp circuit having a first input connected to a supply, a second input connected to chip enable, and a first output. The enable circuit further includes a first inverter having a third input connected to the chip enable, a fourth input connected to the first output of the clamp circuit, and a second output; a second inverter having a fifth input connected to the second output of the first inverter, a sixth input connected to the supply, and a third output; a memory element having a seventh input connected to the third output of the second inverter, an eighth input, and a fourth output; and a comparator having a ninth input connected to the chip enable, a tenth input connected to a reference signal, an eleventh input connected to the fourth output of the memory element, and a fifth output connected to the eighth input of the memory element.

11 Claims, 6 Drawing Sheets

CIRCUIT AND METHOD FOR LOW POWER CHIP ENABLE CIRCUITRY

CROSS REFERENCE TO RELATED APPLICATIONS

This claims the benefit of Provisional Application No. 62/342,032, filed on May 26, 2016, the disclosure of which is incorporate by reference in its entirety.

FIELD OF THE INVENTION

This invention relates to chip enable circuits, particularly to enable circuits used for low power applications.

BACKGROUND

A chip enable circuit is a circuit that generates an enable signal to enable any building block. Such building blocks could be a simple building block, such as an amplifier or a memory cell, a complete system, or a chip that is externally controlled. The enable circuit helps to save the power consumption of the overall device by only enabling the required building block when it is required. The main ports or connections of any enable block are typically the supply, ground, an input signal and an output control signal.

FIG. 1 and FIG. 2 show two prior art enable circuits. The supply is defined as VDD (101), the ground is defined as GND (102), the input enable signal is defined as CE (104), and the output control signal is defined as EN (103). FIG. 1 represents an enable circuit with two inverters. The EN signal (103) could have any two possible voltage level values that represent the ON (112) and OFF (111) states. For the prior art shown in FIG. 1, the ON (112) state has the same voltage level as VDD (101), and the OFF (111) state has the same voltage level as GND (102). The transfer characteristic (109) of this enable circuit is defined as the relationship between the level of the CE (104) signal and the EN (103) signal.

As depicted in FIG. 1, the transfer characteristic toggles between the ON (112) and OFF (111) states depending on the voltage level of CE (104). The threshold voltage, VTH (110), of the enable circuit is defined as the voltage level of the CE (104) that is in between the ON (112) and OFF (111) states and it triggers a transition in the output EN (103) signal. This threshold voltage value (110) can be adjusted by changing the sizing of the transistors M1 (105), M2 (106), M3 (107), and M4 (108). However, this threshold voltage value (110) changes if the supply voltage VDD (101) changes. Thus, this represents a limitation of the shown implementation. In addition, the prior art circuit shown in FIG. 1 does not include any hysteresis in its transfer characteristic (109). Such hysteresis helps in realizing a robust circuit that does not toggle between the ON (112) and OFF (111) states as a result of supply noise.

FIG. 2 shows a prior art enable circuit with a transfer characteristic (213) that has hysteresis. As depicted, the EN signal (203) goes from the OFF (216) to the ON (217) state when the value of the CE signal (204) exceeds VTH2 (215). The EN signal (203) goes from the ON (217) to OFF (216) state if the CE signal (204) goes to a value below VTH1 (214). If the CE signal (204) is between VTH1 (214) and VTH2 (215), the EN signal (203) does not change its state. Similar to the prior art in FIG. 1, values of VTH1 (214) and VTH2 (215) change with the change of the supply level VDD (201).

PRIOR ART

FIG. 1 discusses a prior art (100) circuit where an enable circuit is used to enable any building block. Such block could be a simple building block, such as an amplifier or a memory cell, a complete system, or a chip that is externally controlled. This approach does not solve the issue of having a transfer characteristic with hysteresis. In addition, it does not solve the issue of having a constant threshold voltage, VTH (110) that is independent from the supply VDD (101).

FIG. 2 discusses another prior art (200) circuit for the implementation of the enable circuit. This approach solves the issue of having a transfer characteristic with hysteresis. However, it does not solve the issue of having constant threshold voltage, VTH1 (214) and VTH2 (215) that are independent from the supply VDD (201).

SUMMARY

In general, in one aspect, the invention relates to a novel architecture to reduce the sensitivity of the threshold voltage levels of an enable circuit. In accordance with some embodiments of the invention, an architecture and method to adjust the ON and OFF logic levels of a chip enable circuitry, limiting the voltage supply of a logic circuit to a specified voltage level; generating an ON logic level when the chip enable is higher than a first threshold level; storing the ON logic level in a memory element when the chip enable is higher than a first threshold level; generating an OFF logic level using a comparator when the chip enable is lower than a second threshold level storing the OFF logic level in the memory element when the chip enable is lower than a second threshold level; the output of the memory element is the enable signal to be used inside microchip or system.

One aspect of the invention relates to enable circuits. A enable circuit in accordance with one embodiment of the invention includes a voltage clamp circuit having a first input connected to a supply, a second input connected to the chip enable signal source, and a first output; a first inverter having a third input connected to the chip enable signal source, a fourth input connected to the first output of the clamp circuit, and a second output; a second inverter having a fifth input connected to the second output of the first inverter, a sixth input connected to the supply, and a third output; a memory element having a seventh input connected to the third output of the second inverter, an eighth input, and a fourth output; and a comparator having a ninth input connected to the chip enable signal source, a tenth input connected to a reference signal, an eleventh input connected to the fourth output of the memory element, and a fifth output connected to the eighth input of the memory element.

Another aspect of the invention relates to methods for adjusting ON and OFF logic levels of a chip enable circuit. One method in accordance with one embodiment of the invention includes limiting a voltage supply of a logic circuit to a specified voltage level using a supply clamp circuit; generating an ON logic level when a chip enable signal is higher than a first threshold level; storing the ON logic level in a memory element; generating an OFF logic level using a comparator when the chip enable signal is lower than a second threshold level; and storing the OFF logic level in the memory element.

Other aspects of the invention will become apparent from the following description and the accompanying drawings.

BRIEF DESCRIPTION OF DRAWINGS

The appended drawings illustrate several embodiments of the invention and are not to be considered limiting of its scope, for the invention may admit to other equally effective embodiments.

DETAILED DESCRIPTION

Figure 1:
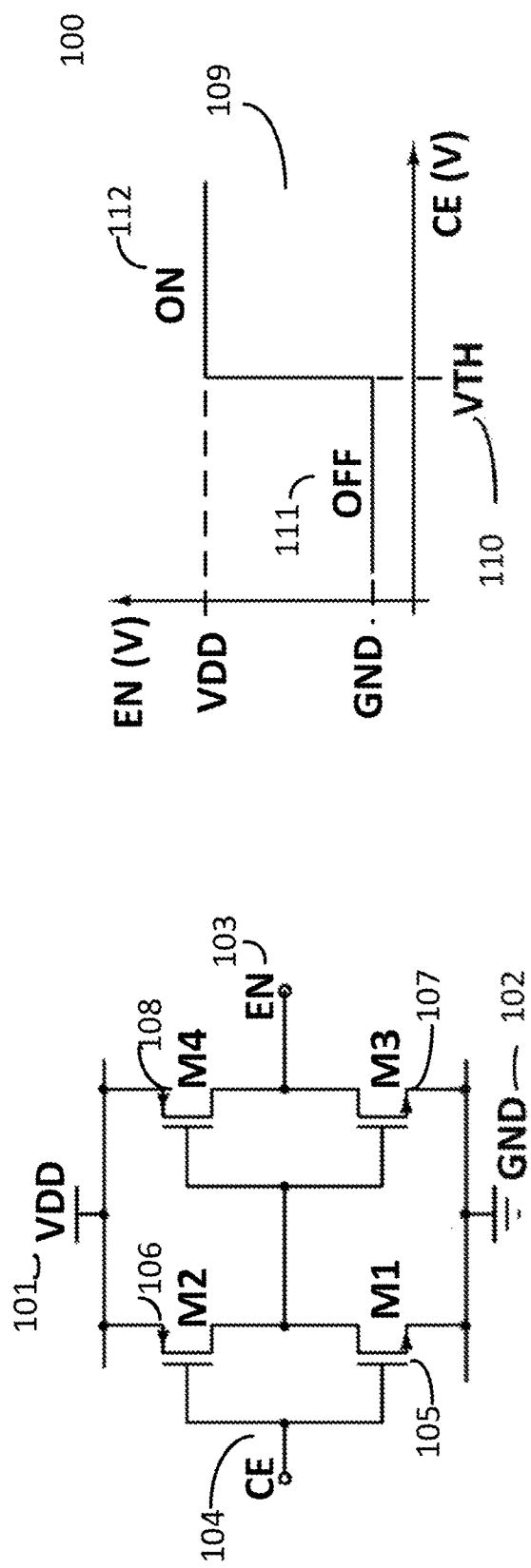
FIG. 1 shows a schematic block-level circuit diagram and a transfer characteristic of a prior art enable circuit.

Aspects of the present disclosure are shown in the above-identified drawings and are described below. In the description, like or identical reference numerals are used to identify common or similar elements. The drawings are not necessarily to scale and certain features may be shown exaggerated in scale or in schematic in the interest of clarity and conciseness.

Embodiments of the invention relate to a low power chip enable circuit with reduced supply sensitivity (i.e., more immune to supply voltage variations). In accordance with embodiments of the invention, threshold voltage levels are independent of the voltage level of the supply VDD (101 in FIGS. 1 and 201 in FIG. 2). In accordance with embodiments of the invention, an improved low power chip enable circuit may consume very low power, such as using a total current of less than 50 nA. In contrast, the threshold voltage levels of prior art power chip enable circuits are dependent on the input supply levels VDD (101 in FIGS. 1 and 201 in FIG. 2).

In accordance with embodiments of the invention, a low power chip enable circuit with a reduced supply sensitivity may be implemented on a microchip, such as a semiconductor integrated circuit. Throughout this disclosure, the terms "enable circuit," "chip enable circuit," "improved enable circuit," and "low power enable circuit" may be used interchangeably depending on the context.

Figure 3:
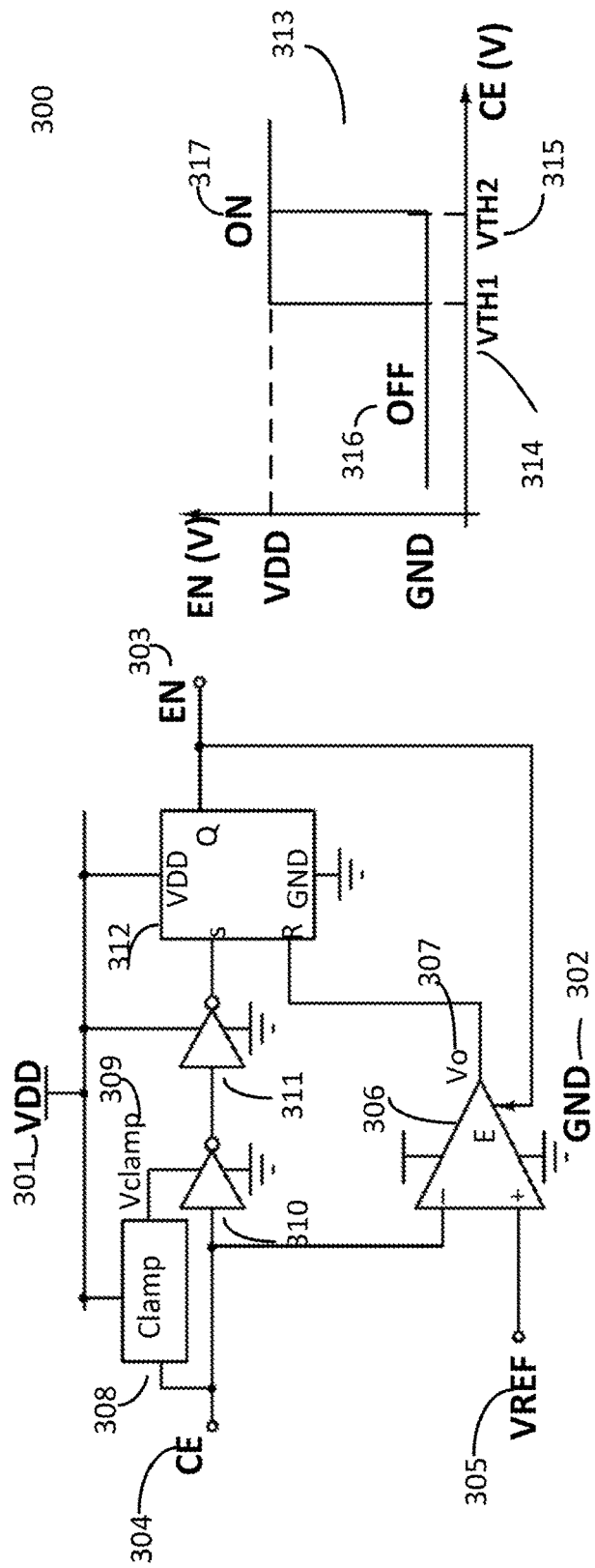
FIG. 3 shows a block diagram of an enable circuit in accordance with one embodiment of the invention.

FIG. 3 shows a schematic block-level diagram of an example of an improved enable circuit (300) that includes an input supply VDD (301), a ground GND (302), an input for a chip enable signal CE (304), an output for an enable control signal (303), a reference voltage, Vref, (305), a supply clamp circuit (308), a first inverter (310), a second inverter (311), a set/reset latch (312), and a comparator (306). One skilled in the art would appreciate that this example is for illustration only and that other modifications and variations are possible without departing from the scope of the invention.

In accordance with embodiments of the invention, possible implementations of the inverters (310 and 311) may include, but are not limited to, a static complementary metal-oxide-semiconductor (CMOS) inverter and/or a dynamic inverter. In addition, the first (310) and the second (311) inverters could be replaced by a single buffer circuit. A buffer circuit is a circuit that produces an output having the same level as that of an input. In addition, as discussed below in reference to FIG. 4, the first and second inverters may also be implemented using transistors. An "inverter" as used in this description refers to a circuit or component that can produce a low output when the input is high, and vice versa. Therefore, the term "inverter" is used herein broadly to include any implementations known in the art that can achieve this function.

In accordance with embodiments of the invention, the supply clamp circuit (308) may be implemented with any supply power clamp known in the art. Examples of such supply voltage clamp may include, but are not limited to, a diode and/or a transistor clamp circuit. As used herein, a supply clamp circuit is a circuit that can reduce the sensitivity of threshold voltages (e.g., VTH (110) in FIG. 1, VTH1 (214) and VTH2 (215) in FIG. 2) to the supply level VDD (e.g., 101 in FIGS. 1 and 201 in FIG. 2).

In accordance with embodiments of the invention, possible implementations of the comparator (306) may include, but are not limited to, a static comparator, a dynamic comparator, a single-stage amplifier, and/or a multi-stage amplifier.

In accordance with embodiments of the invention, possible implementations of the set/reset latch (312) may include, but are not limited to, an SR latch and/or a clocked latch with reset. This set/reset latch (312) produces an output high if the set terminal (S) signal goes high and keeps this output level high even if the set terminal (S) signal goes low. The output of the set/reset latch (312) goes low only if the reset terminal (R) signal goes high. The SR latch is reset dominant, which indicates that if both the set terminal (S) and reset terminal (R) are high, the output of the SR latch is low. Thus, the set/reset latch (312) remembers the logic state high once set by the set terminal (S) signal until this logic state high is changed to a logic state low by a high signal from the reset terminal (R). Accordingly, the set/reset latch (312) may be referred to generically as a "memory element." Any circuits or components known in the art capable of this function may be used as a "memory element" according to embodiments of the invention, one example of which is shown as two NOR gates in FIG. 4.

While FIG. 3 illustrates an example of a possible implementation of embodiments of the invention. One or more modules and elements shown in FIG. 3 may be omitted, repeated, and/or substituted. Accordingly, embodiments of the invention should not be construed as limited to the specific arrangements of modules shown in FIG. 3.

Figure 2:
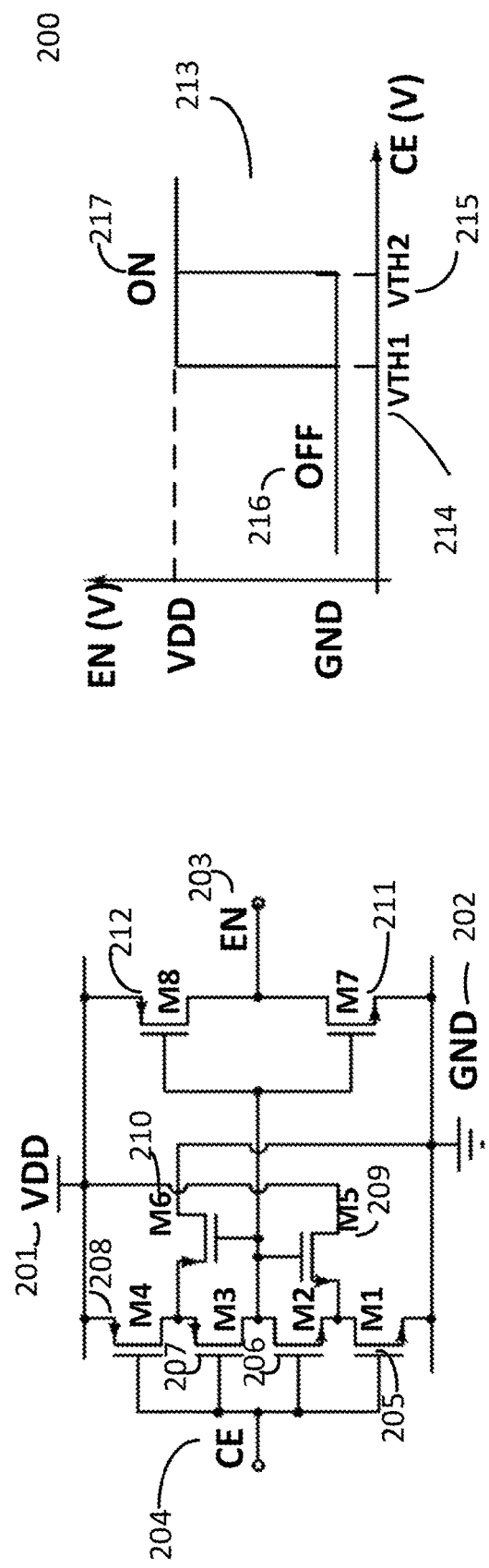
FIG. 2 shows a schematic block-level circuit diagram and a transfer characteristic of a prior art enable circuit.

In accordance with embodiments of the invention, reducing the sensitivity of the threshold voltages (e.g., VTH(110) in FIG. 1, VTH1 (214) and VTH2 (215) in FIG. 2) to variations of the supply level VDD (e.g., 101 in FIGS. 1 and 201 in FIG. 2) may be achieved by including a supply clamp circuit (308). The supply clamp circuit (308) may be powered from the input supply VDD (301) and may produce an output voltage, Vclamp (309), which is less sensitive to the variations of the supply level VDD (301). This Vclamp (309) voltage may provide power to the first inverter (310). Because Vclamp (309) is relatively constant, the threshold voltage VTH2 (314) will be almost constant and has less dependency on the supply level VDD (301).

The operation of an enable circuit in accordance with embodiments of the invention can be explained as follows: When the voltage level of the CE signal (304) starts to increase, the clamp circuit (308) is enabled, producing an almost constant voltage level at Vclamp (309). The CE signal (304) is also connected to the input of the first inverter (310). The output of the first inverter (310) goes low when the voltage level of CE (304) exceeds the threshold voltage VTH2 (315) of the first inverter (310). This threshold voltage VTH2 (315) is dependent on the sizing of the first inverter (310) and the value of Vclamp (309).

The second inverter (311) acts as an inverter and can also scale the output voltage level to the main input supply VDD (301). Once the input to the second inverter (311) goes low, the output of the second inverter (311) goes high with the same voltage level as VDD (301). The output of the second inverter (311) drives a set/reset latch (312). When the set terminal (S) of the set/reset latch (312) goes high, the output signal (Q) of the set/reset latch (312) goes high, producing an enable signal EN (303) at the output of the enable circuit. This enable signal also turns on the comparator (306) by controlling its terminal E. When the voltage level of the CE signal (304) drops to a value lower than the voltage level VREF (305), the output of the comparator Vo (307) goes high. The comparator Vo (307) is connected to the reset terminal (R) of the set/reset latch (312) to force the voltage level of the EN signal (303) to go low, i.e., to turn off the enable signal EN (or to produce a disable signal). In this implementation, the value of the threshold voltage VTH1 (314) is equal to the voltage level of VREF (305). It is very important to understand that the VREF (305) voltage signal is only required to detect when the CE signal (304) drops. VREF (305) is not needed to detect when the CE signal (305) transitions from low to high.

Figure 4:
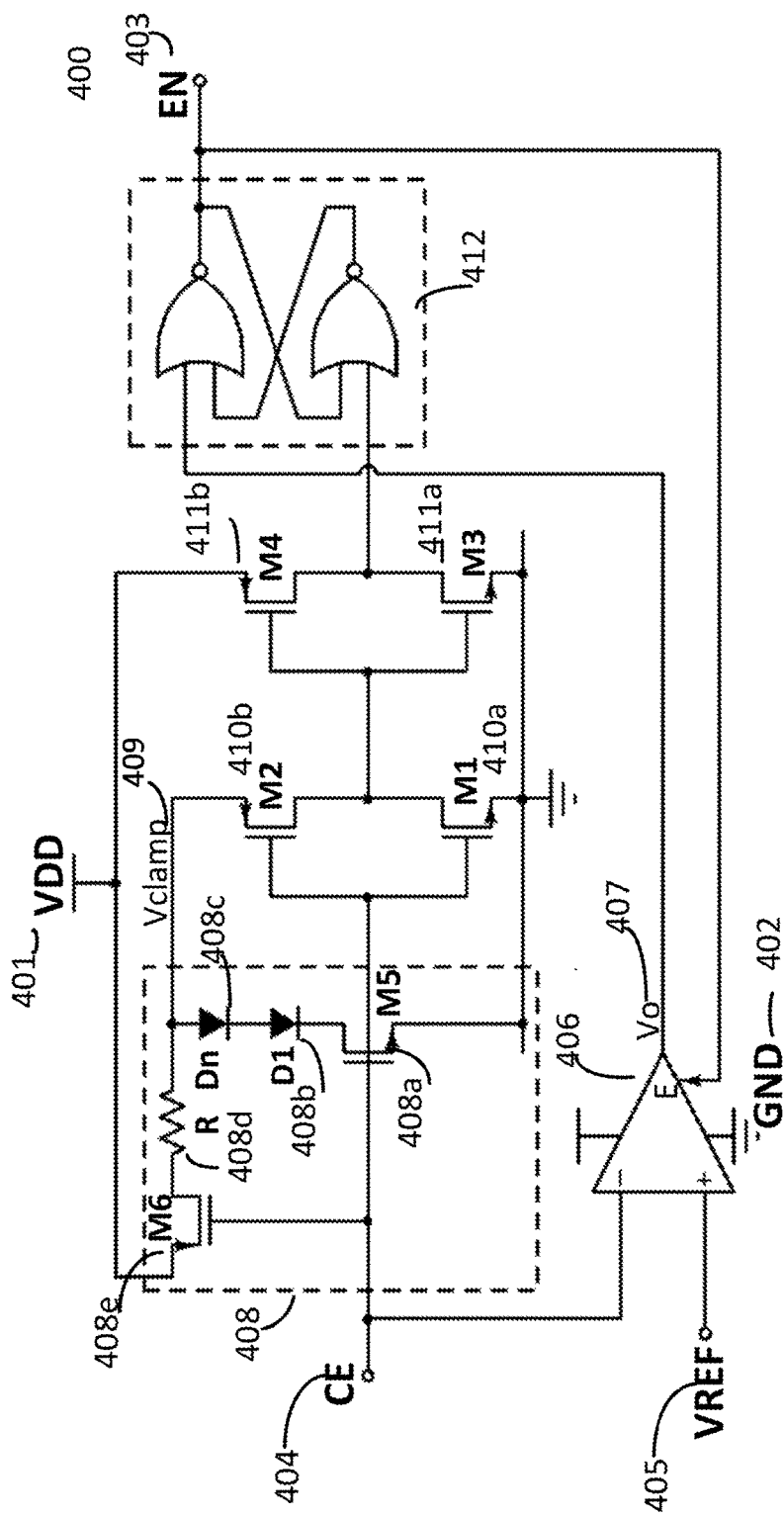
FIG. 4 shows one possible implementation of an enable circuit in accordance with one embodiment of the invention.

FIG. 4 shows an implementation of an enable circuit in accordance with one embodiment of the invention. In this implementation, the clamp circuit (308) is implemented using a transistor M5 (408*a*), a transistor M6 (408*e*), a resistance R (408*d*), and diodes D1 to Dn (408*b* and 408*c*). The number of diodes in series determines the value of the voltage level of Vclamp (409). The transistors M5 (408*a*) and M6 (408*e*) ensure that the enable circuit does not consume current when the voltage level of CE (404) is low. The resistance R (408*d*) limits the current during the transition from the ON state (317) to the OFF state (316), and vice versa. One skilled in the art would appreciate that this implementation is one example of a clamp circuit and that other clamp circuits known in the art may also be used without departing from the scope of the invention.

Referring to FIG. 3 and FIG. 4, the two inverters (310) and (311) shown in FIG. 3 may be implemented using a conventional static CMOS technology with transistors M1 (410*a*), M2 (410*b*), M3 (411*a*), and M4 (411*b*), as shown in FIG. 4. Again, one skilled in the art would appreciate that other similar circuits known in the art may also be used without departing from the scope of the invention. Finally, the set/reset latch (412) (or memory element) may be implemented using two NOR gates, as shown in FIG. 4.

Figure 5:
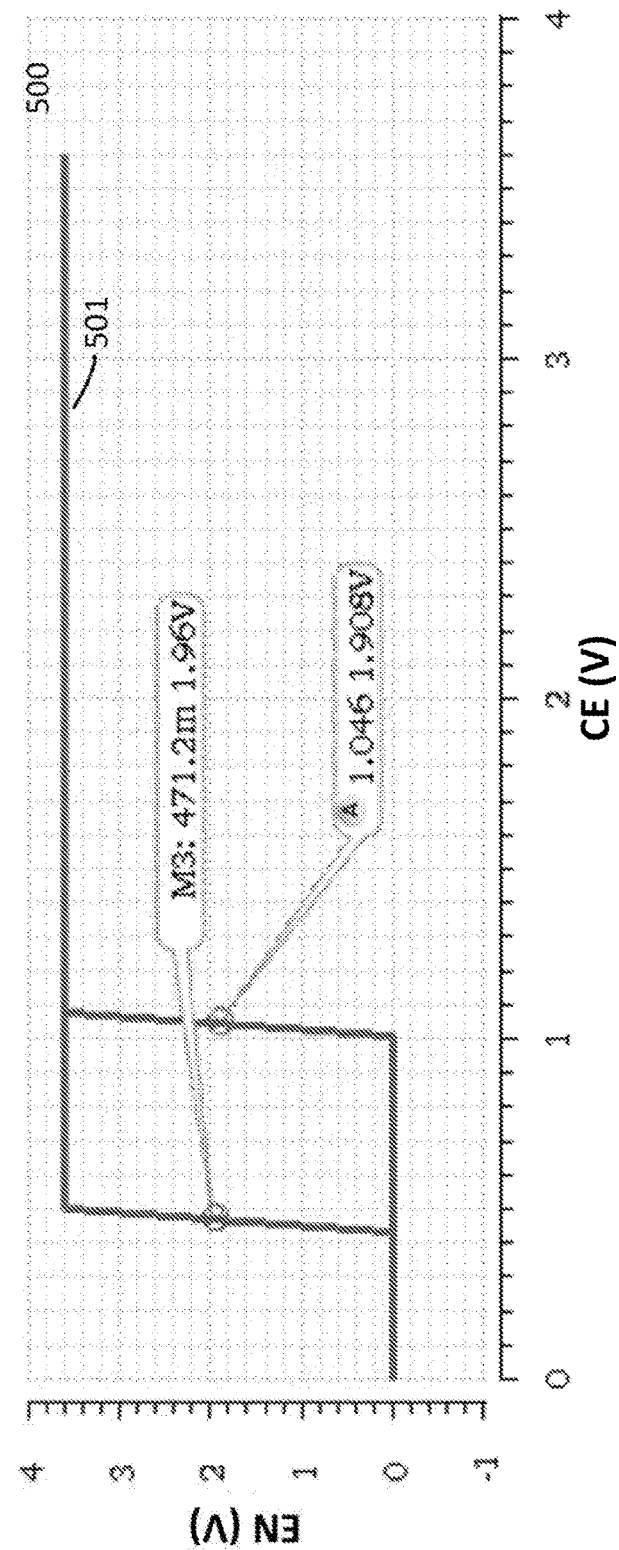
FIG. 5 shows exemplary simulation results for the enable circuit shown in FIG. 4.
Figure 6:
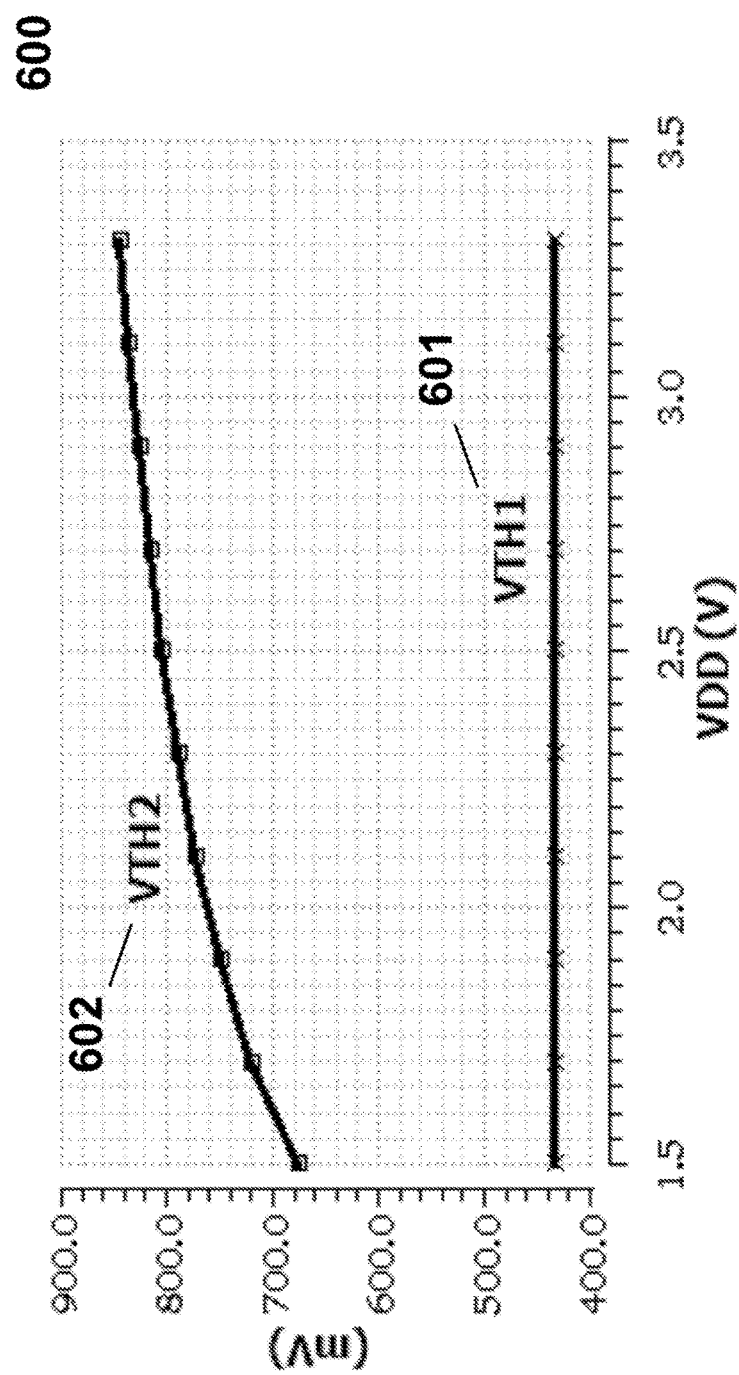
FIG. 6 shows exemplary simulation results for the enable circuit shown in FIG. 4.

FIG. 5 shows exemplary simulation results for the enable circuit (400) shown in FIG. 4. Specifically, FIG. 5 shows exemplary simulation results for VTH1 (314) and VTH2 (315) as the input voltage level of CE (404) changes from zero to the supply level VDD (401) when VDD (401) is set to 3.6V. FIG. 6 shows VTH1 (314) and VTH2 (315) as a function of VDD (401). It can be seen that VTH1 (314) is a constant 0.44V regardless of the VDD (401) level, and VTH2 (315) varies by less than 0.2V when VDD (401) varies from 1.5V to 3.3V.). These simulation results demonstrate that the values of VTH1 (314) and VTH2 (315) are less sensitive to the value of VDD (401). In contrast, prior art enable circuit architectures show large sensitivity to the value of the supply voltage VDD (401).

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An enable circuit, comprising:
   a voltage clamp circuit having a first input connected to a supply, a second input connected to chip enable, and a first output;
   a first inverter having a third input connected to the chip enable, a fourth input connected to the first output of the clamp circuit, and a second output;
   a second inverter having a fifth input connected to the second output of the first inverter, a sixth input connected to the supply, and a third output;
   a memory element having a seventh input connected to the third output of the second inverter, an eighth input, and a fourth output; and
   a signal comparator having a ninth input connected to the chip enable, a tenth input connected to a reference signal, an eleventh input connected to the fourth output of the memory element, and a fifth output connected to the eighth input of the memory element.

2. The enable circuit of claim 1, wherein the voltage clamp circuit is configured to produce an output voltage level that is less sensitive to a voltage level of the supply.

3. The enable circuit of claim 1, wherein the first inverter produces a logic high at the second output if the third input is low and produces a logic low at the second output if the third input is high.

4. The first inverter of claim 3, wherein a threshold voltage of the first inverter is higher than a voltage level of the reference signal.

5. The enable circuit of claim 1, wherein the second inverter produces a logic high at the third output if the fifth input is low and produces a logic low at the third output if the fifth input is high.

6. The enable circuit of claim 1, wherein the memory element comprises two NOR gates.

7. The enable circuit of claim 1,
   wherein the memory element stores a logic state at the fourth output,
   wherein the fourth output is high when the seventh input is a logic high, and the fourth output is a logic low when the eighth input is high, and
   wherein the fourth output does not change its logic state if the seventh input and/or the eighth output changes to a logic low.

8. The enable circuit of claim 1, wherein the signal comparator produces a logic state low if a signal level of the ninth input is higher than a signal level of the tenth input, and produces a logic state high if the signal level of the ninth input is lower than the signal level of the tenth input.

9. An enable circuit, comprising:
   a voltage clamp circuit having a first input connected to a supply, a second input connected to chip enable, and a first output;
   a buffer, connected to the first output of the clamp circuit and the supply, having a second output;
   a memory element having a third input connected to the second output of the buffer, a fourth input, and a third output; and
   a signal comparator having a fifth input connected to the chip enable, a sixth input connected to a reference signal, an seventh input connected to the third output of the memory element, and a fourth output connected to the fourth input of the memory element.

10. A method for adjusting ON and OFF logic levels of a chip enable circuitry, comprising:
  limiting a voltage supply of a logic circuit to a specified voltage level using a supply clamp circuit;
  generating an ON logic level when a chip enable signal is higher than a first threshold level;
  storing the ON logic level in a memory element;
  generating an OFF logic level using a comparator when the chip enable signal is lower than a second threshold level; and
  storing the OFF logic level in the memory element.

11. The method of claim 10, wherein the output of the memory element is an enable signal to be used inside a microchip or system.

* * * * *